United States Patent [19]

Smooha

[11] Patent Number: 4,990,802

[45] Date of Patent: Feb. 5, 1991

[54] ESD PROTECTION FOR OUTPUT BUFFERS

[75] Inventor: Yehuda Smooha, South Whitehall Twp., Lehigh County, Pa.

[73] Assignee: AT&T Bell Laboratories, Murray Hill, N.J.

[21] Appl. No.: 541,183

[22] Filed: Jun. 19, 1990

Related U.S. Application Data

[63] Continuation of Ser. No. 275,048, Nov. 22, 1988, abandoned.

[51] Int. Cl.⁵ ............... H03K 19/003; H03K 19/007; H03K 19/094; H03K 17/08
[52] U.S. Cl. ............................. 307/482.1; 307/296.5; 307/443; 307/542; 307/451; 307/303.2; 357/23.13; 361/58; 361/91
[58] Field of Search ............... 307/296.4, 296.5, 585, 307/304, 443, 448, 451, 279, 91, 590, 605, 542, 558, 559, 482.1, 542, 544, 450, 296.8, 303.2; 357/23.13; 361/56, 58, 91

[56] References Cited

U.S. PATENT DOCUMENTS

| | | | |
|---|---|---|---|
| 3,655,996 | 4/1972 | Takahashi | 361/91 |
| 4,066,918 | 1/1978 | Heuner et al. | 361/56 X |
| 4,209,713 | 6/1980 | Satou et al. | 307/443 |
| 4,514,646 | 4/1985 | Ando et al. | 357/23.13 X |
| 4,692,781 | 9/1987 | Rountree et al. | 357/23.13 |
| 4,698,529 | 10/1987 | Asami | 307/542 |
| 4,704,547 | 11/1987 | Kirsch | 307/443 |
| 4,734,752 | 3/1988 | Liu et al. | 307/304 X |
| 4,736,271 | 4/1988 | Mack et al. | 307/304 X |
| 4,775,912 | 10/1988 | Menniti et al. | 357/23.13 X |
| 4,825,102 | 4/1989 | Iwasawa et al. | 307/558 X |
| 4,825,107 | 4/1989 | Naganuma et al. | 307/465 |
| 4,829,350 | 5/1989 | Miller | 357/23.13 |

FOREIGN PATENT DOCUMENTS 0257774 3/1988 European Pat. Off. .
57-63861 4/1982 Japan .
60-224259 11/1985 Japan .
62-84546 4/1987 Japan .

OTHER PUBLICATIONS

Dingwall, "Improved COS/MOS Inverter Circuit for Reducing Burn-Out and Latch-Up", RCA Tech. Notes, TN No. 1230, 7/25/79.
IEEE/IRPS, 1986, "ESD Protection Reliability luM CMOS Technologies", by C. Duvvury, R. A. McPhee, D. A. Baglee, and R. N. Rountree, pp. 199-205.
IEEE/IRPS, 1987, "ESD Phenomena and Protection Issues in CMOS Output Buffers", by C. Duvvury, R. N. Rountree, Y. Fong, and R. A. McPhee, pp. 174-180.
IEEE/IRPS, 1987, "A Circular Output Protection Device Using Bipolar Action", by Masaki Momodomi, Mitsugi Ogura, and Eiji Kozuka, pp. 169-173.
IEEE Industry Applications Society Annual Meeting-Part II, 1987, "ESD Protection: Design and Layout Issues for VLSI Circuits", C. Duvvury, R. N. Rountree, and R. A. McPhee, pp. 1668-1673.

Primary Examiner—Stanley D. Miller
Assistant Examiner—David R. Bertelson
Attorney, Agent, or Firm—J. H. Fox

[57] ABSTRACT

An integrated circuit obtains improved protection of output buffers against damage from electrostatic discharge (ESD). Each output buffer is connected to its bondpad by means of a resistor, and protective clamping diodes are disposed around the periphery of the bondpad. It has been found that a suitably sized resistor allows the protective diodes to discharge an ESD event before damage to the buffer occurs, by reducing current flow through the buffer, without significantly limiting performance.

6 Claims, 2 Drawing Sheets

ESD PROTECTION FOR OUTPUT BUFFERS

This application is a continuation of application Ser. No. 275,048, filed Nov. 22, 1988, now abandoned.

BACKGROUND OF THE INVENTION

1. Field of the Invention

The present invention concerns an integrated circuit having an output buffer with improved protection against electrostatic discharge.

2. Description of the Prior Art

Numerous techniques have been developed to protect the input circuitry in integrated circuits from electrostatic discharge (ESD). In particular, the gates of insulated gate transistors are known to be susceptible to damage from an ESD event. In order to protect the inputs, various combinations of clamping diodes, transistors, and resistors are used between the input bondpad and the input transistors to limit the voltage that appears at the input gates. In the past, it has generally been assumed that output buffers, with their relatively low output impedance as compared to input gates, were much less susceptible that input gates to ESD damage. However, it has recently been found that the output buffers of MOS integrated circuits may also be quite susceptible to damage from ESD events. This appears to be especially true when the output buffers have a metal silicide contact layer on the gate and the source/drain diffused regions; see, for example, "ESD Phenomena and Protection Issues in CMOS Output Buffers" by C. Duvvury et al, *IEEE International Reliability Physics Symposium* at pages 174–180(1987). Although protective clamping diodes have also been used for the protection of output buffers, these have not provided as high an amount of protection as desired in many cases.

One problem with protecting output buffers is that the value of the resistors traditionally used to protect input circuitry is typically on the order of hundreds or even thousands of ohms. Such a value is much too high for use with output buffers, since the buffer must sometimes drive large capacitive loads (e.g., typically greater than 10 picofarads, and often greater than 100 picofarads). Therefore, an output resistor on the order of several hundred ohms (or more) would reduce the output switching speed of the buffer to an unacceptably slow value. In addition, the sinking and sourcing current capability of the buffers would be degraded with the use of a large value resistor. For these reasons, it has been considered desirable to use as good a conductor as possible between the output buffer and the bondpad, in order to allow the external load to be switched at high speed. This normally means that the metal (e.g., aluminum) layer of the integrated circuit is used to form the conductor between the output buffer and the bondpad. However, in some cases wherein only a single metal level is present on the integrated circuit, layout considerations have caused the underlying polysilicon or metal silicide layer to be used for this purpose. That is, when an aluminum conductor is required to overlie the output buffer, as for a power bus, a silicide layer is used to connect the output buffer to the bondpad. However, unless required for this or other purposes, the use of a polysilicon or silicide link between the output buffer and the bondpad has been avoided in the prior art, to preserve high performance.

SUMMARY OF THE INVENTION

I have invented an integrated circuit technique wherein output buffers are protected from electrostatic discharge. A protective voltage clamping device, typically a pair of diodes or a bipolar transistor, is formed at the periphery of the bondpad associated with a protected output buffer. A resistor having a resistance greater than 1 ohm, and typically less than 20 ohms, is included between the drain of at least the n-channel transistor in a given buffer and the corresponding bondpad. The present technique may be implemented using a silicide resistor for the protection of an output buffer having silicided gate, source, and drain electrodes.

DETAILED DESCRIPTION

Figure 1:
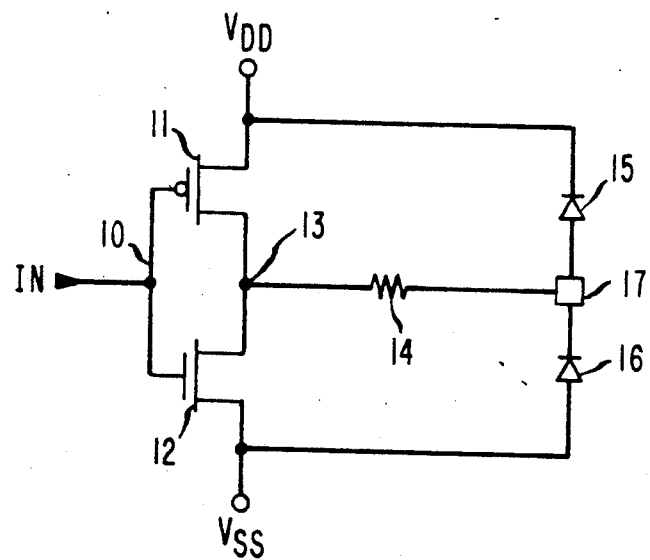
FIG. 1 shows schematically an output buffer protected according to the inventive technique.

The present invention relates to an integrated circuit having improved protection against electrostatic discharge (ESD). I have found that the inventive technique affords a significant improvement as measured by the "human body model", discussed below, even for silicided output buffers that are the most susceptible to breakdown. Furthermore, the present technique has a minimal effect on the performance of the protected output buffer, and may be implemented in CMOS technology without additional processing steps. Referring to FIG. 1, an output buffer in CMOS technology comprises p-channel transistor 11 and n-channel transistor 12 having their drains connected to a common buffer output node 13. The inventive technique provides that a silicide resistor 14 be connected between the node 13 and the output bondpad 17. Furthermore, voltage clamping diodes 15 and 16 are connected to the bondpad and to the power supply conductors $V_{DD}$ and $V_{SS}$ accordingly. As discussed below, the diodes 15 and 16 are disposed around the periphery of the bondpad to minimize resistance and inductance, thereby ensuring fast clamping action for maximum protection. Surprisingly, I have found that the value of resistor 14 in this arrangement may be very low, allowing good performance, while still achieving a significant improvement in ESD protection on the human body model test, discussed below. In a typical case, the value of this resistor is in the range of 2 to 10 ohms, although a higher value is suitable in the case of a relatively small output buffer driving a small load. I estimate that a value up to about 20 ohms is useful for small output buffers, whereas a value as low as 1 ohm still provides useful protection, while allowing for high performance from a relatively large output buffer.

Figure 2:
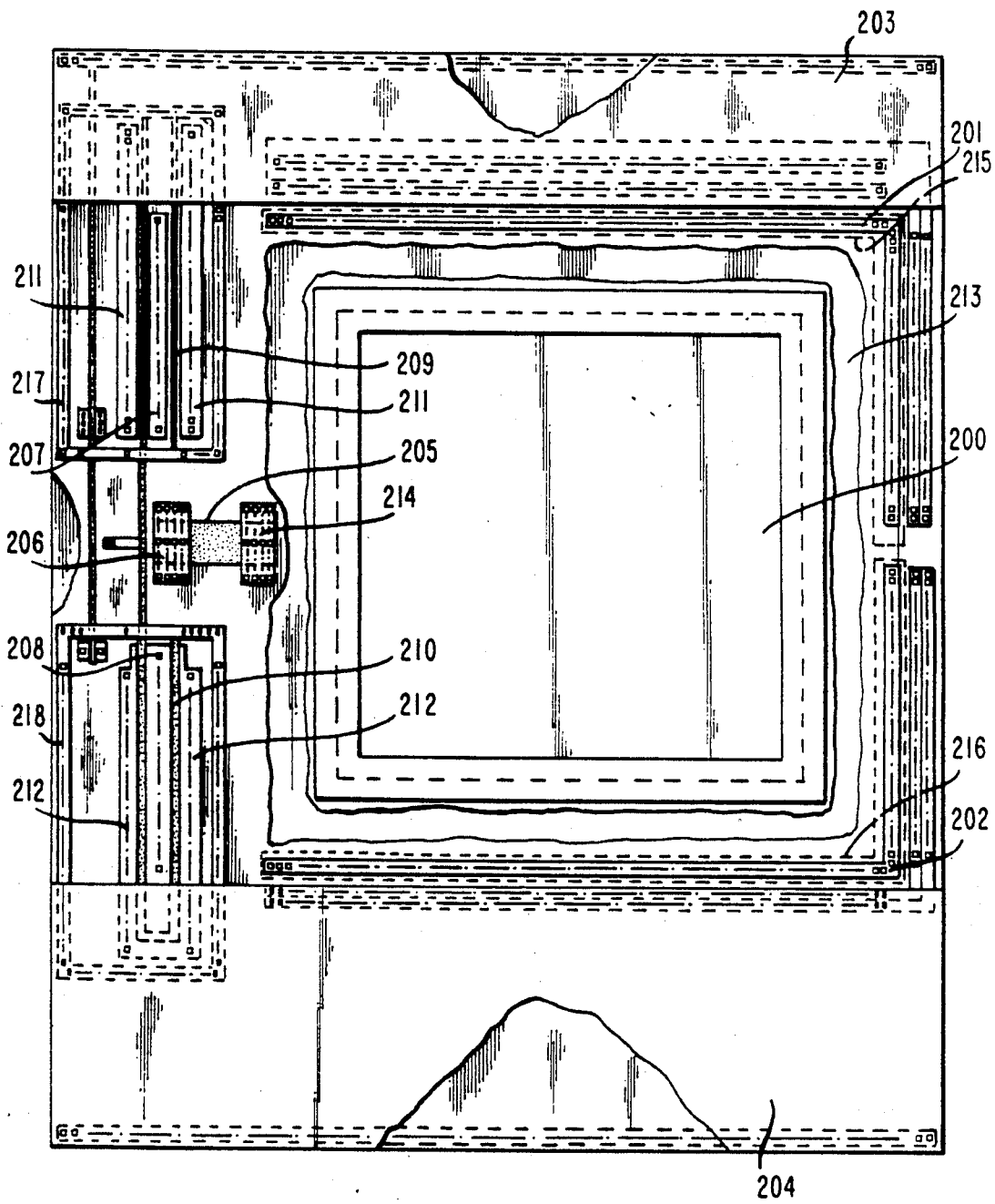
FIG. 2 shows a typical layout of the output buffer of FIG. 1.

Referring to FIG. 2, a top view of a typical layout according to the inventive technique is shown. An output bondpad, typically aluminum, has a central portion 200 that is used for wire bonding to a package terminal. The periphery 213 of the bondpad is covered with an insulator, typically being a portion of a silicon dioxide or silicon nitride "cap" layer. The top half (as viewed) of the periphery of the bondpad extends down through contact windows 201 to a p-type semiconductor region 215, which forms the anode of diode 15. The underlying n-type semiconductor region (typically a n-tub) forms the cathode of diode 15, and is connected through contact windows to the positive power supply voltage ($V_{DD}$) conductor 203. Similarly, the bottom half of the bondpad is connected through contact windows 202 to the n-type cathode region 216 of diode 16. The underlying p-type anode region of diode 16 (typically a p-tub) is connected through contact windows to the negative power supply voltage ($V_{SS}$) conductor 204. A further explanation of these protective diodes may be found in coassigned U.S. patent application 096,290 filed Sept. 14, 1987, which is incorporated by reference herein.

The metal silicide link 205 connects the bondpad to the output buffer, and provides the required resistance for proper ESD protection. For example, a link of titanium silicide having a thickness of 100 nanometers (1000 angstroms), a width of 10 micrometers, and a length of 20 micrometers provides a resistance of about 3 ohms. Other geometries may readily be determined that obtain the desired resistance, based upon the resistivity of the silicide employed, which is about 1.5 ohms per square in the case of titanium silicide. The bondpad is connected to one side of the silicide resistor through contact windows 214. The drains of the p and n channel output transistors underlie metal contact regions 207 and 208, respectively, which contact the other side of the resistor through contact windows 206. Regions 209 and 210 are the gate electrodes, and regions 211 and 212 are the metal contacts to the sources of the p and n channel output transistors, respectively. The p-channel transistor is surrounded by an optional guard ring, comprising a metal layer 217 connected to $V_{DD}$, which contacts a n-type ring located thereunder. Similarly, the n-channel transistor is surrounded by an optional guard ring comprising metal layer 218 connected to $V_{SS}$, which contacts a p-type ring thereunder.

EXAMPLE

In order to determine the effectiveness of the present technique, a series of five output buffers were constructed as shown in FIG. 2. The p-channel output transistor had a channel length of 1 micrometers and a width of 50 micrometers, whereas the n-channel output transistor had a channel length of 1 micrometers and a width of 32 micrometers. The gate, source and drain electrodes had a layer of titanium silicide thereon, formed by the salicide process. The resistor (205 in FIG. 2) was also formed of titanium silicide (on doped polysilicon), and had a different value for each buffer. Each buffer was tested according to the human body model specification, which discharges a 100 picofarad capacitor through a 1500 ohm resistor into the output pin connected to the bondpad. The $V_{SS}$ and $V_{DD}$ pins were grounded, while the other pins were left floating. For each buffer, the capacitor was charged up to a high voltage and discharged through the output buffer 5 times. The voltage level was increased, and the test repeated; the voltage at which the buffer failed was recorded. The results are as listed in the Table:

| Buffer No. | Resistor (ohms) | Failure voltage (volts) |
|---|---|---|
| 1 | 0 | 1300 |
| 2 | 2.5 | 1700 |
| 3 | 5.0 | 1850 |
| 4 | 8.75 | 2350 |
| 5 | 13.75 | 2700 |

It is typically desirable to obtain a failure voltage of at least 2000 volts on the human body model test (although a lower amount is suitable for some applications). The above results show that this may be obtained using a resistor of about 8 ohms in the manner described. Still other values may be selected depending on the protection desired and output load.

In order to distinguish the case wherein a metal silicide interconnect has been used in the prior art between the output buffer and the bondpad for layout reasons, the embodiment of FIGS. 1 and 2 is described in terms of integrated circuits having two (or more) metal interconnect levels. For example, in the illustrative embodiment of FIG. 2, the central portion of the metal bondpad 200 includes both the first and second metal layers. Similarly, the $V_{DD}$ and $V_{SS}$ busses 203 and 204 are formed from both the first and the second metal layer, whereas the source/drain contacts 207, 208, 211, 212 are formed from only the first level metal layer. In the case wherein two (or more) metal levels are available, layout problems do not require that the silicide layer be used for the bondpad-to-output-buffer interconnect. Hence, it has been avoided in the prior art due to a lack of understanding of its beneficial effect when combined with clamping diodes for ESD protection.

Figure 3:
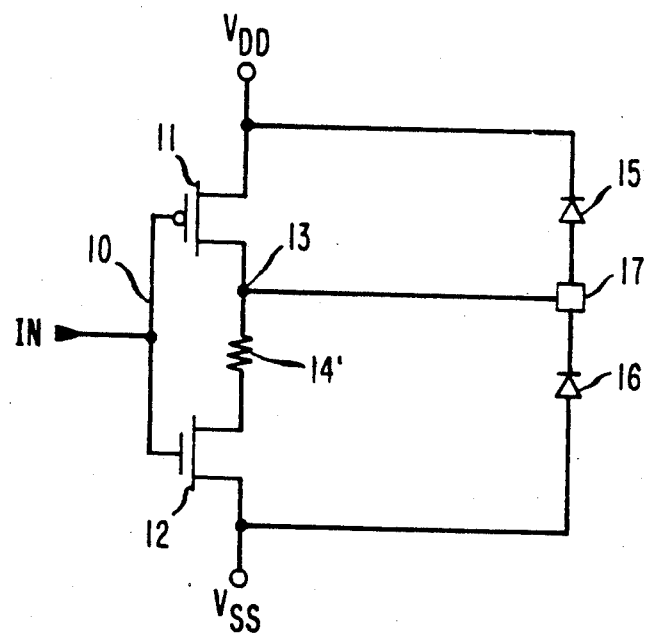
FIG. 3 shows an alternate embodiment of an output buffer protected according to the inventive technique.

As shown in the embodiment of FIGS. 1 and 2, the protective resistor 14 is connected between the output node 13 and the bondpad 17. This usually results in the most convenient layout for the buffer circuitry. However, it is alternately possible to connect the protective resistor between the drain of the n-channel transistor 12 and the output node 13. This results in the connection of the protective resistor as shown as 14' in FIG. 3. This still results in a substantial improvement in ESD performance, since the n-channel transistor in practice is more susceptible to ESD damage than the p-channel transistor 11. Furthermore, it allows the p-channel device, which typically tends to have a lower performance than the n-channel device, to be connected directly to the bondpad. Note that it does not appear that the connection of FIG. 3 has been required in the prior art for layout purposes with either single level or multi-level interconnect techniques. Note also that in either case, the protective resistor is in the path between the drain of the n-channel transistor 12 and the bondpad 17.

A silicided resistor has been shown in the illustrative embodiment herein, which is compatible with the "salicide" technique for forming silicided source, drain, and gate electrodes. It is of course very advantageous to be able to solve the ESD problem in such structures, which are more susceptible to ESD than other designs. Furthermore, the salicide technique is becoming increasingly common with integrated circuits at the submicron level. However, the teachings of the present invention are not limited to the use of silicided resistors, or with the salicide technique. For example, a polysilicon resistor, or doped semiconductor substrate region (i.e., a so-called "diffused" resistor) may be used to provide the resistance in the desired range. Furthermore, it is well known to form transistors having silicided gate regions, but which do not include a silicide layer on the source/drain regions. Such transistors also obtain improved ESD protection by the use of the inventive technique.

In still another embodiment of the invention, a protective bipolar transistor may be connected to the bondpad in lieu of the diodes illustrated. In that case, the bondpad is connected around a substantial portion of its periphery to a n+ collector region in a p-tub tied to $V_{SS}$. A p base region is located underneath a field oxide region adjacent to the collector, with a n+ region tied to $V_{SS}$ on the other side of the field oxide serving as the emitter. In some instances, the emitter n+ region may be omitted, with the reverse-breakdown voltage of the resulting diode then serving to clamp the positive voltages applied to the bondpad, and the forward conduction of the diode serving to clamp the negative voltages. A further explanation of this type of voltage clamping device may be found in U.S. Pat. No. 4,821,089, filed June 4, 1987 and co-assigned with the present application.

I claim:

1. An integrated circuit comprising at least two levels of metal conductors and an output buffer having a p-channel transistor and an n-channel transistor having their drains coupled to a common buffer output node, and a bondpad connected to an external conductor,
   characterized in that said integrated circuit further comprises a resistor having a resistance of greater than 1 ohm connected between the drain of said n-channel transistor and said bondpad, and still further comprises voltage clamping means connected to said bondpad,
   wherein said resistor is a polysilicon or silicide resistor, and wherein the drain of said p-channel transistor is directly connected to said bondpad by means of a metal conductor.

2. The integrated circuit of claim 1 wherein said resistor has a value of greater than 2 ohms.

3. The integrated circuit of claim 1 wherein said resistor has a value of less than 10 ohms.

4. The integrated circuit of claim 1 wherein said resistor has a value of less than 20 ohms.

5. The integrated circuit of claim 1 wherein said output transistors have silicided gate, source, and drain electrodes, and said resistor is a silicided resistor.

6. The integrated circuit of claim 1 wherein said voltage clamping means is a pair of diodes, wherein the first diode of said pair has a p-type anode region connected to said bondpad and an n-type cathode region connecte to a positive power supply voltage conductor, and the second diode of said pair has a n-type cathode region connected to said bondpad and a p-type anode region connected to a negative power supply voltage conductor.

* * * * *